(12) United States Patent
Bende et al.

(10) Patent No.: US 10,056,514 B2
(45) Date of Patent: Aug. 21, 2018

(54) BACK SIDE CONTACT LAYER FOR PV MODULE WITH BY-PASS CONFIGURATION

(71) Applicant: Stichting Energieonderzoek Centrum Nederland, Petten (NL)

(72) Inventors: Evert Eugène Bende, Petten (NL); Bas Bernardus van Aken, Petten (NL); Nicolas Guillevin, Petten (NL); Markus Johan Jansen, Petten (NL); Ilkay Cesar, Petten (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 24 days.

(21) Appl. No.: 15/300,289

(22) PCT Filed: Mar. 31, 2015

(86) PCT No.: PCT/EP2015/057021
§ 371 (c)(1),
(2) Date: Sep. 29, 2016

(87) PCT Pub. No.: WO2015/150382
PCT Pub. Date: Oct. 8, 2015

(65) Prior Publication Data
US 2017/0186901 A1    Jun. 29, 2017

(30) Foreign Application Priority Data
Apr. 2, 2014   (NL) ..................................... 2012554

(51) Int. Cl.
*H01L 31/0224* (2006.01)
*H01L 31/05* (2014.01)
(Continued)

(52) U.S. Cl.
CPC ...... *H01L 31/0443* (2014.12); *H01L 27/1421* (2013.01); *H01L 31/02013* (2013.01);
(Continued)

(58) Field of Classification Search
CPC ....... H01L 31/022441; H01L 31/02245; H01L 31/022458; H01L 31/0516; H01L 31/0508;
(Continued)

(56) References Cited

U.S. PATENT DOCUMENTS

| 5,972,732 A | 10/1999 | Gee et al. |
| 2007/0095384 A1* | 5/2007 | Farquhar ......... H01L 31/022441 136/244 |

(Continued)

FOREIGN PATENT DOCUMENTS

| WO | 2011/160151 A1 | 12/2011 |
| WO | 2012/026806 A1 | 3/2012 |

(Continued)

*Primary Examiner* — Lindsey Bernier
(74) *Attorney, Agent, or Firm* — NLO N.V.; Catherine A. Shultz; Lindsey A. Auerbach

(57) ABSTRACT

Back side connection layer for a photo-voltaic module with a plurality of PV-cells. The PV-cells are of a type having a plurality of back side contacts. A by-pass diode connection path is formed in the back side connection layer along an edge direction of two adjacent cells with a straight or meandering pattern around outer contacts of the plurality of back side contacts of the two adjacent cells.

18 Claims, 3 Drawing Sheets

(51) Int. Cl.
   *H01L 31/046*    (2014.01)
   *H01L 31/0465*   (2014.01)
   *H01L 31/0443*   (2014.01)
   *H01L 31/044*    (2014.01)
   *H01L 27/142*    (2014.01)
   *H01L 31/02*     (2006.01)

(52) U.S. Cl.
   CPC .......... *H01L 31/02245* (2013.01); *H01L 31/022441* (2013.01); *H01L 31/022458* (2013.01); *H01L 31/044* (2014.12); *H01L 31/046* (2014.12); *H01L 31/0465* (2014.12); *H01L 31/0508* (2013.01); *H01L 31/0516* (2013.01); *Y02E 10/50* (2013.01)

(58) Field of Classification Search
   CPC .......... H01L 27/1421; H01L 31/046; H01L 31/0465; H01L 31/0443; H01L 31/044; Y02E 10/50
   See application file for complete search history.

(56) References Cited

U.S. PATENT DOCUMENTS

| | | | |
|---|---|---|---|
| 2010/0012172 A1 | 1/2010 | Meakin et al. | |
| 2010/0051085 A1* | 3/2010 | Weidman | H01L 31/022441 136/244 |
| 2012/0081857 A1* | 4/2012 | Nakazono | H02S 40/34 361/714 |

FOREIGN PATENT DOCUMENTS

| | | |
|---|---|---|
| WO | 2012/173480 A2 | 12/2012 |
| WO | 2013/182955 A2 | 12/2013 |

\* cited by examiner

*Fig. 1* -- PRIOR ART --
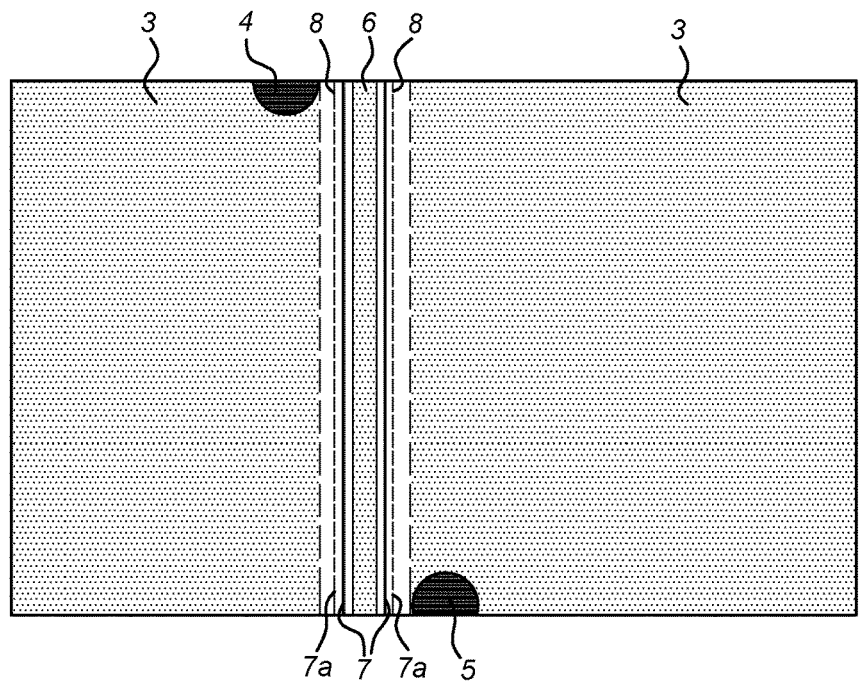
*Fig. 2*
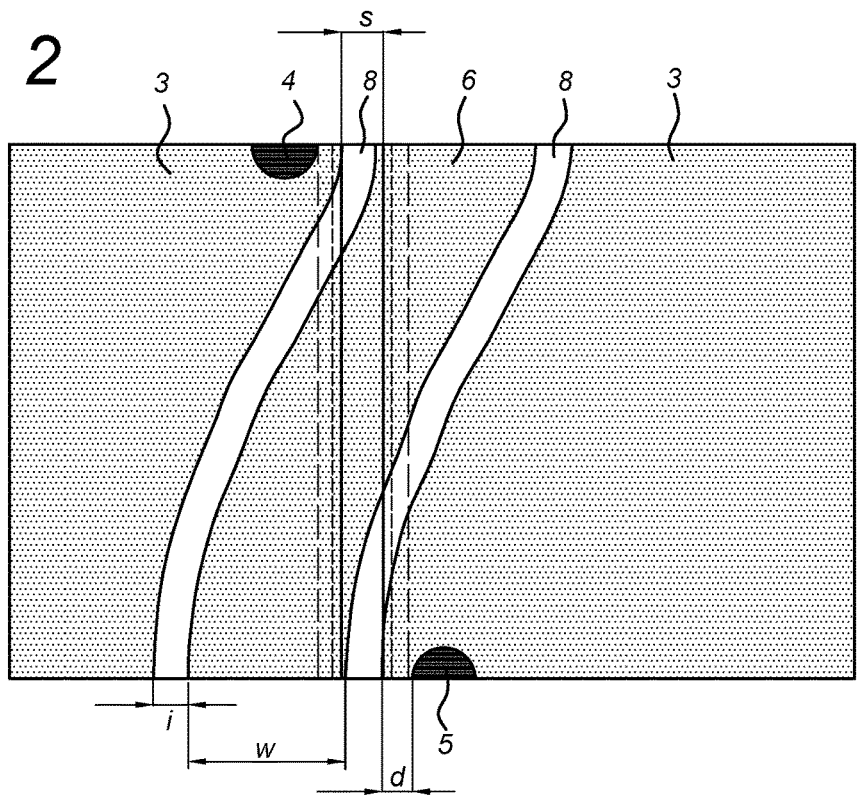

BACK SIDE CONTACT LAYER FOR PV MODULE WITH BY-PASS CONFIGURATION

FIELD OF THE INVENTION

The present invention relates to a back side connection layer (in the form of a foil or substrate) for connecting positive and negative back side contacts of a plurality of photovoltaic (PV) cells for forming a photo-voltaic module.

PRIOR ART

International patent publication WO2013/182955 discloses a back-sheet for photovoltaic modules comprising back-contact solar cells. A conductive back-sheet is provided formed as a connecting circuit to electrodes of the solar cells of the module.

International patent publication WO2012/026806 discloses a photovoltaic device and module having an improved passivation of surfaces. It comprises a circumferential outer wall and/or an aperture wall intended for a back contact metal wrap-through photovoltaic device. A pn-junction is provided between a first and second semiconductor layer.

International patent publication WO2011/160161 discloses a photovoltaic module coupled on a back side to an electrically conducting or conductive and structured layer for conducting electrical energy generated in the solar cell. In one embodiment an electrical component can be embedded in the conductive structured layer for a solar cell.

SUMMARY OF THE INVENTION

The present invention seeks to provide an improved back side contact layer for a photovoltaic module allowing incorporation of a by-pass circuit.

According to the present invention in a first aspect, a back side contact layer according to the preamble defined above is provided, wherein a by-pass diode connection path having a predetermined minimal width (w) is formed in the back side connection layer along an edge direction of two adjacent cells, the two adjacent cells being positioned at an inter-cell distance (s) from each other, wherein outer contacts on each of the adjacent cells are displaced to a distance (d) from an edge of the respective adjacent cell, wherein the distance d is larger than 0, such that the total distance between a row of outer contacts (2d+s) is larger than or equal to the sum of the predetermined minimal width (w) and the width (2i) of two scribe lanes adjacent to the by-pass diode connection path (or in mathematical terms 2d+s≥w+2i).

In a second aspect, a back side contact layer according to the preamble defined above is provided, wherein a by-pass diode connection path having a predetermined minimal width (w) is formed in the back side connection layer along an edge direction of two adjacent cells, the two adjacent cells being positioned at an inter-cell distance (s) from each other, with a meandering pattern around outer contacts positioned near edges of the two adjacent cells. In similar mathematic terms as in the first aspect, this would relate as 2d+s<w+2i.

Both aspect of the present invention, and the further embodiments as described in the further dependent claims, allow a more efficient lay-out of the back side contact layer and a by-pass diode conductor of a more suitable width.

SHORT DESCRIPTION OF DRAWINGS

The present invention will be discussed in more detail below, using a number of exemplary embodiments, with reference to the attached drawings, in which FIG. 1 shows a detail view of a back side contact layer part overlying two adjacent PV cells with a strip conductor for a by-pass diode connection according to a prior art embodiment;

FIG. 2 shows a detail view of a back side contact layer part overlying two adjacent PV cells with a strip conductor for a by-pass diode connection according to an embodiment of the present invention;

DETAILED DESCRIPTION OF EXEMPLARY EMBODIMENTS

Figure 3:
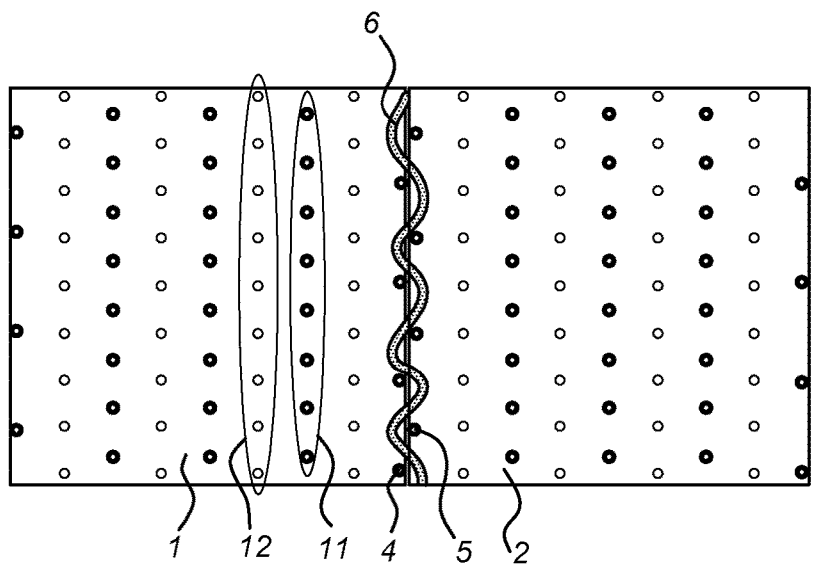
FIG. 3 shows a schematic view of two adjacent PV cells having edge contacts and a conducting strip according the embodiment of FIG. 2.

The present invention embodiments relate to an improved lay-out and placement of a back side connecting sheet in a photovoltaic module having a plurality of photovoltaic cells 1 utilizing by-pass diodes and associated circuitry to improve performance of the PV module when e.g. partially shaded.

FIG. 1 shows a detail view of a part of back side contact layer 3 overlying two adjacent PV cells (of which only the edges 7 are indicated). The back side contact layer 3 includes a strip conductor 6 for a by-pass diode connection, which is positioned in between two contact layer parts 3, separated by two scribe lanes 8. In a typical set-up of a PV module, two PV cells are positioned adjacent to each other with a spacing of 1.25 mm (nominal, between the solid line edges 7) which may even be further apart as indicated by the small dash line 7a (1.75 mm apart). The adjacent cells are provided with back side contacts at their outer edge, or outer contacts 4, 5, of which one is shown for each of the adjacent cells in FIG. 1. In order to fit a by-pass diode conductor 6 in the available space in the back side contact layer 3, the by-pass diode conductor 6 has a typical width of only 0.75 mm (as 1 mm wide scribe lanes 8 are needed to provide sufficient isolation).

If two cells 1, 2 (see also FIGS. 3 and 4) are adjacent and both cells 1, 2 have contacts on the back side of the solar cell and are positioned along the edges, then in between the cells 1, 2 there is hardly any room for a Cu-strip (by-pass diode conductor 6) that is extending towards the junction box, as is clear from FIG. 1 and the description above. The room between the contacts 4, 5 of two neighboring cells 1, 2 is small. Moreover to manufacture the strip 6, isolation scribes 8 of typically 1 mm are needed, which also 'eats' away conductive material in between the contacts 4, 5. This then would lead to a very small strip 6 that should be able to carry a current of typically 9 A and would therefore lead to a high power dissipation, which can be detrimental to the device and has an adverse effect of module operation under shade conditions.

As an example thereof the following calculations can be made for a small Cu track for a by-pass diode. The properties of a typical foil used for the bypass diode conductor 6 are a length l=0.5 m; a thickness t=35 μm, a width w=0.75 mm and a resistivity ρ=17.10$^{-9}$ Ωm, resulting in a resistance $$R = \frac{\rho \cdot l}{w \cdot t} \cong 1/3\Omega.$$

In a conducting state the by-pass diode typically carries a current of 8 A, which implies a power dissipation of P=R $I^2 \cong 21$ W. Since a typical PV module power rating is about 200 W, this would result in a loss of more than 10%, which is not acceptable.

This problem may be solved in a first aspect of the present invention by a group of embodiments wherein a by-pass diode connection path 6 having a predetermined minimal width (w) is formed in the back side connection layer 3 along an edge direction of two adjacent cells 1, 2, the two adjacent cells being positioned at an inter-cell distance (s) from each other, wherein outer contacts 4, 5 on each of the adjacent cells are displaced to a distance (d) from an edge of the respective adjacent cell such that the total distance between a row of outer contacts 2d+s is larger than the sum of the predetermined minimal width (w) and the width (2i) of two scribe lanes adjacent to the by-pass diode connection path 6. In mathematical terms, the distance (d) of outer contact 4, 5 of two neighboring the cells 1, 2 is chosen to meet the formula 2d+s>w+2i. The resulting by-pass diode connection path 6 may in this group of embodiments even be implemented as a straight metallization path.

In FIG. 2, a further solution for this problem is provided, in the sense that a by-pass diode connection path 6 having a predetermined minimal width (w) is formed in the back side connection layer 3 along an edge direction of two adjacent cells 1, 2, the two adjacent cells being positioned at an inter-cell distance (s) from each other, with a meandering pattern around outer contacts 4, 5 positioned near edges of the two adjacent cells 1, 2. Note that in this group of embodiments the distance d can even be equal to zero, i.e. the outer contact are arranged directly on an edge of the cell 1, 2. This has a more optimal current path on the cell 1, 2 as a consequence and results in less metal usage on the cell (often this is Ag and therefore costly).

More generically, the plurality of cells 1, 2 comprise cells having a symmetric pattern of the positive and negative back side contacts 11, 12, wherein a subset 4, 5 of positive or negative back side contacts are arranged along the edge direction of neighboring cells 1, 2. Examples of such cells 1, 2 are Interdigitated Back Contact (IBC) cells or Emitter Wrap Through (EWT) cells, In a further embodiment, the two adjacent cells 1, 2 are oriented with respect to each other such that the outer contacts 4, 5 are interspersed along the edge direction. E.g. in the case of a PV cell 1, 2 having a length l along the edge direction of the two adjacent cells 1, 2, a number of n contacts are positioned equidistantly at one edge with an offset 0, and with an offset of l/2n at the opposite edge. This is shown more clearly in the schematic view of FIG. 3, where n=4. The back side contacts 11, 12 of the used PV cells 1, 2 are indicated using open rounds and solid rounds, as in back side contact PV cells both the positive and negative contacts are provided in a pattern adjacent to each other. It is noted that in the PV module, PV cells 1, 2 as described above are invariant for 180 degrees rotation, allowing an easy PV cell placement for PV module manufacturing.

In a further embodiment the positive and negative back side contacts 11, 12 are arranged in a plurality of rows, and an outer one of the plurality of rows comprising the outer contacts 4, 5 has less contacts than the other of the plurality of rows 11, 12. This will allow a more smooth meandering of the conductive lead for the bypass diode (by-pass diode conductor 6) and thus provides advantages for the manufacturing of the back side connection layer, more particular for providing the isolation lanes 8 therein, e.g. by scribing.

By realizing a meandering conductive track 6 and by positioning the edge contacts 4, 5 of two adjacent cells 1, 2 in an interspersed fashion as shown in FIG. 3 the conductive lead for the bypass diode (by-pass diode conductor 6) can be realized having a greater width than in the prior art embodiment, e.g. having a width of at least 2 mm or even 5 mm. This can be combined with a further embodiment, wherein the inter-cell distance (s) between two adjacent cells is less than 2 mm. These solutions also allows modules with more than three bypass diodes in a single PV module. More generally, the present invention also relates to a photovoltaic module comprising a plurality of photovoltaic cells and a back side connection layer according to any one of the embodiments described herein.

The present invention in general relates to a configuration of back contacted cells 1, 2 with contacts 4, 5 along the edges attached to a PCB-like Cu-foil (back side connection layer 3) that comprises small strips 6 of Cu-foil that meanders in between the edge contacts 4, 5 of adjacent cells 1, 2. The by-pass diode connection path 6 extends to a junction box connection part of the back side connection layer 3 in a further embodiment. The by-pass connection path 6 can then stretch out towards the junction box where they are connected to bypass diodes and where they form a bypass circuit in a usual fashion for PV modules. The contacts 4, 5 of two adjacent cells 1, 2 are interspersed, allowing a meandering path 6 in between the edge contacts 4, 5 of either cells 1, 2 that can in an alternating way be under the first cell and the second, neighboring, cells 1, 2.

Figure 4:
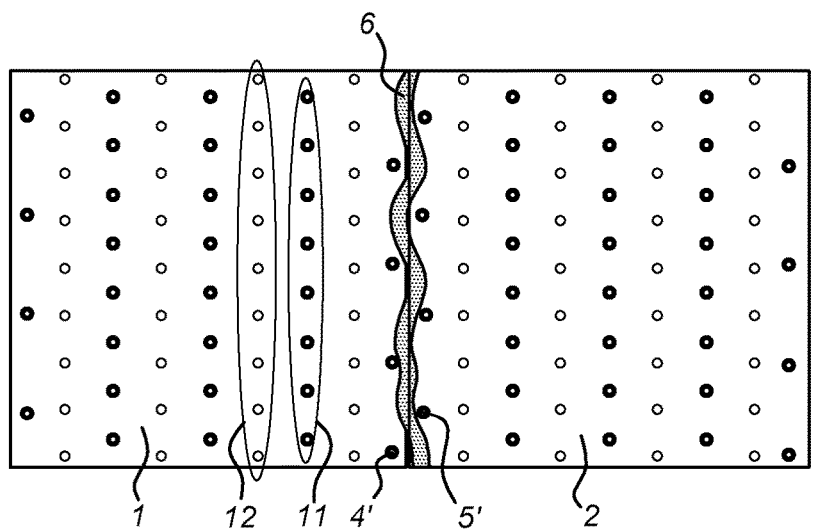
FIG. 4 shows a schematic view of two adjacent PV cells having edge contacts and a conducting strip according to a further embodiment of the present invention.
Figure 5:
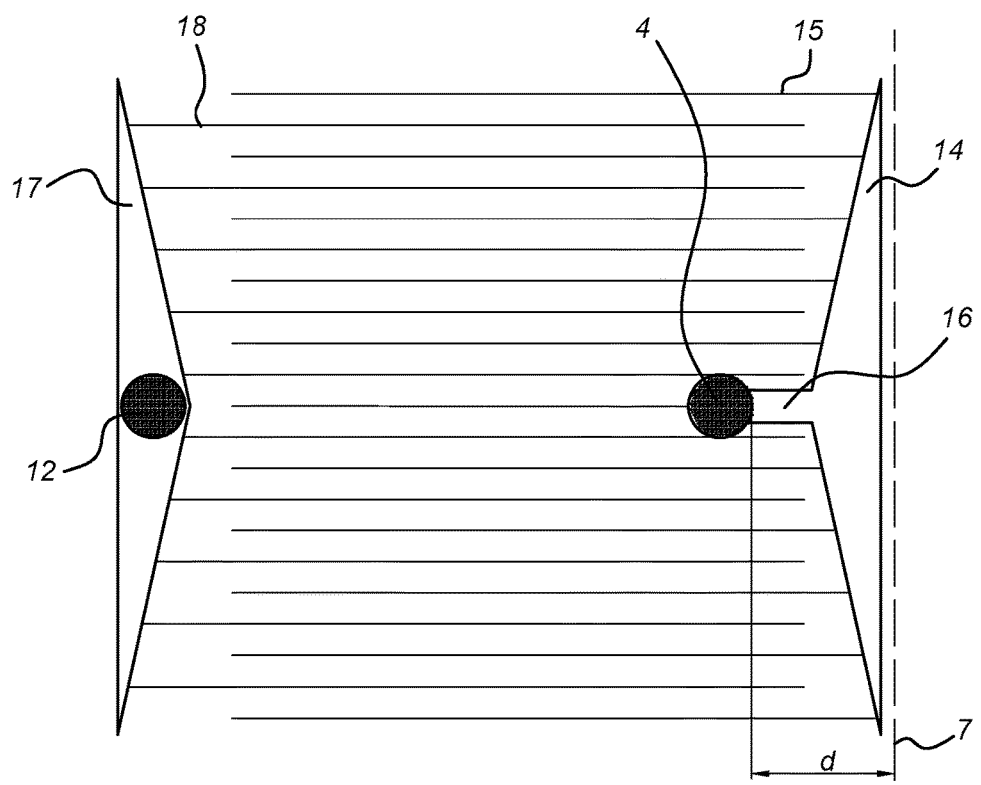
FIG. 5 shows a schematic view of an embodiment of the present invention where an edge contact is indented.

In a further embodiment, which is shown schematically in FIG. 4, the meandering conductive path 6 is provided for the purpose of bypass diode connection, in a metal foil 3 in combination with back-contacted cells (IBCs, EWTs) with multiple current collection points 11, 12, on their back side of which a subset (outer contacts 4', 5') is positioned close by the edges of the cell 1, 2. Or in other words, the outer contacts 4', 5' of two adjacent cells 1, 2 are indented toward a center of the respective cell 1, i.e. away from the edge of the cell 1, 2. This can e.g. be implemented using an indented busbar configuration, e.g. using an 'elbow' type or 90 degree configuration, as shown schematically in the embodiment depicted in FIG. 5 In this drawing, the current collecting lines 15, 18 are shown, together with the collection busbars 14, 17. On one side of this PV cell, a contact 12 is provided, whereas on the other side, the contact 4 is displaced over the distance d, using a further conductor 16.

Or, in respect to regular PV cells 1, 2 having edge contacts, the outer back contacts 4', 5' on an edge of a cell 1, 2 are moved towards the center of the cell 1, 2, away from the edge (cf. the outer contacts 4, 5 in FIG. 4 in comparison to the embodiment of FIG. 3). In this embodiment, a more smoothly meandering pattern may be used for the by-pass diode conductor 6, having an even larger width than the embodiment described with reference to FIG. 3.

The present invention embodiments allow application of a foil technology for back-contacted cells 1, 2 with contacts 4, 5 positioned along the edges of the cell 1, 2 (which is required by cell symmetry), and allows realizing a metal foil-based PV module with back contacted cells including but not limited to IBC cells and EWT cells, wherein standard bypass circuit can be integrated.

In a further embodiment, the back side connection layer further comprises a by-pass diode directly connected to the by-pass diode connection path 6, i.e. as part of the contacting foil 3, which allows protection of the by-pass diodes as well by an encapsulating layer of the PV module.

The present invention embodiments have been described above with reference to a number of exemplary embodiments as shown in the drawings. Modifications and alternative implementations of some parts or elements are possible, and are included in the scope of protection as defined in the appended claims.

The invention claimed is:

1. A photovoltaic module comprising a plurality of photovoltaic cells and a conductive back side connection layer electrically connecting positive back side contacts on a back side of adjacent cells of the plurality of photovoltaic (PV) cells, and electrically connecting negative back side contacts on a back side of the adjacent cells of the plurality of photovoltaic (PV) cells, wherein the back side connection layer comprises
   an electrically conductive by-pass diode connection path having a width (w) along an edge direction of two of the adjacent cells, the two adjacent cells being positioned at an inter-cell distance (s) from each other,
   two isolation scribe lanes adjacent to the by-pass diode connection path, the bypass diode connection path being positioned in between two contact layer parts of the back side connection layer and separated by the two isolation scribe lanes,
   wherein edge contacts, which are a subset of the positive and negative back side contacts, on each of the adjacent cells are arranged at a distance (d) from an edge of the respective adjacent cell, wherein the distance (d) is larger than 0, such that the total distance (2d+s) is larger than or equal to the sum of the width (w) of the by-pass diode connection path and a width (2i) of the two isolation scribe lanes adjacent to the by-pass diode connection path,
   wherein the photovoltaic module further comprises a by-pass diode directly connected to the by-pass diode connection path.

2. The photovoltaic module according to claim 1, wherein the plurality of cells comprise cells having a symmetric pattern of the positive and negative back side contacts.

3. The photovoltaic module according to claim 1, wherein the two adjacent cells are oriented with respect to each other such that the edge contacts are interspersed along the edge direction.

4. The photovoltaic module according to claim 1, wherein the positive and negative back side contacts are arranged in a plurality of rows, and wherein an outer one of the plurality of rows comprising the edge contacts has less contacts than the other of the plurality of rows.

5. The photovoltaic module according to claim 1, wherein the edge contacts of the two adjacent cells are indented toward a center of the respective cell.

6. The photovoltaic module according to claim 1, wherein the plurality of cells comprise Interdigitated Back Contact cells or Emitter Wrap Through cells.

7. The photovoltaic module according to claim 1, wherein the by-pass diode connection path extends to a junction box connection part of the back side connection layer.

8. The photovoltaic module according to claim 1, wherein the width (w) of the by-pass diode connection path is at least 2 mm.

9. The photovoltaic module according to claim 1, wherein the inter-cell distance (s) between the two adjacent cells is less than 2 mm.

10. A photovoltaic module comprising a plurality of photovoltaic cells and a conductive back side connection layer electrically connecting positive back side contacts on a back side of adjacent cells of the plurality of photovoltaic (PV) cells, and electrically connecting negative back side contacts on a back side of the adjacent cells of the plurality of photovoltaic (PV) cells,
   wherein the back side connection layer comprises an electrically conductive by-pass diode connection path having a width (w) along an edge direction of first and second adjacent cells, the first and second adjacent cells being positioned at an inter-cell distance (s) from each other, the by-pass diode connection path comprising a meandering pattern around edge contacts on the first and second cell, the edge contacts being a subset of the positive and negative back side contacts, and positioned near edges of the first and second adjacent cells, the meandering path comprising a continuous path extending around a first edge contact on the first cell followed by extending around an edge contact on the second cell and then extending around a second edge contact on the first cell; and
   wherein the photovoltaic module further comprises a by-pass diode directly connected to the by-pass diode connection path.

11. The photovoltaic module according to claim 10, wherein the plurality of cells comprise cells having a symmetric pattern of the positive and negative back side contacts.

12. The photovoltaic module according to claim 10, wherein the first and second adjacent cells are oriented with respect to each other such that the edge contacts are interspersed along the edge direction.

13. The photovoltaic module according to claim 10, wherein the positive and negative back side contacts are arranged in a plurality of rows, and wherein an outer one of the plurality of rows comprising the edge contacts has less contacts than the other of the plurality of rows.

14. The photovoltaic module according to claim 10, wherein the edge contacts are arranged directly on an edge of the respective cell.

15. The photovoltaic module according to claim 10, wherein the edge contacts of the first and second adjacent cells are indented toward a center of the respective cell.

16. The photovoltaic module according to claim 10, wherein the plurality of cells comprise Interdigitated Back Contact cells or Emitter Wrap Through cells.

17. The photovoltaic module according to claim 10, wherein the by-pass diode connection path extends to a junction box connection part of the back side connection layer.

18. The photovoltaic module according to claim 10, wherein the width (w) of the by-pass diode connection path is at least 2 mm.

* * * * *